United States Patent [19]
Botez et al.

[11] Patent Number: 4,547,396
[45] Date of Patent: Oct. 15, 1985

[54] METHOD OF MAKING A LASER ARRAY

[75] Inventors: Dan Botez, Mt. Holly; John C. Connolly, Cranbury, both of N.J.

[73] Assignee: RCA Corporation, Princeton, N.J.

[21] Appl. No.: 665,538

[22] Filed: Oct. 26, 1984

Related U.S. Application Data

[62] Division of Ser. No. 505,489, Jun. 17, 1983, abandoned.

[51] Int. Cl.⁴ .............................................. H01S 31/19
[52] U.S. Cl. ...................................... 427/87; 148/171; 427/108
[58] Field of Search ................... 427/87, 108; 148/171

[56] References Cited

U.S. PATENT DOCUMENTS

| | | | |
|---|---|---|---|
| 3,701,047 | 10/1972 | Caplan et al. | 331/94.5 |
| 3,741,825 | 6/1973 | Lockwood et al. | 148/171 |
| 3,753,801 | 8/1973 | Lockwood et al. | 148/171 |
| 3,960,618 | 1/1973 | Kawamura et al. | 148/171 |
| 3,978,428 | 8/1976 | Burnham et al. | 331/94.5 |
| 4,023,993 | 5/1977 | Scifres et al. | 148/172 |
| 4,033,796 | 7/1977 | Burnham et al. | 148/175 |
| 4,073,676 | 2/1978 | Aiki et al. | 156/624 |
| 4,092,659 | 5/1978 | Ettenberg | 357/18 |
| 4,178,564 | 12/1979 | Ladany et al. | 331/94.5 |
| 4,251,298 | 2/1981 | Thompson | 148/171 |
| 4,255,717 | 3/1981 | Scifres et al. | 331/94.5 |
| 4,280,106 | 7/1981 | Scifres et al. | 331/94.5 |
| 4,302,729 | 11/1981 | Burnham et al. | 331/94.5 |
| 4,317,085 | 2/1982 | Burnham et al. | 372/50 |
| 4,321,556 | 3/1982 | Sakuma | 372/45 |
| 4,326,176 | 4/1982 | Aiki et al. | 372/45 |
| 4,347,486 | 8/1982 | Botez | 372/46 |
| 4,373,989 | 2/1983 | Beggs | 156/635 |
| 4,385,389 | 5/1983 | Botez | 372/48 |

OTHER PUBLICATIONS

Funakoshi et al., Journal of Crystal Growth, 45, 252-256, (1978).
Scifres et al., Electronics Letters, vol. 18, No. 13, 549-550, (Jun. 24, 1982).
Scifres et al., Electronics Letters, vol. 19, No. 5, 169-171, Mar. 3, 1983).
Chen et al., Journal of Applied Physics, 52 (2), 614-620, (Feb. 1981).

Primary Examiner—James R. Hoffman
Attorney, Agent, or Firm—Birgit E. Morris; Donald S. Cohen; William J. Burke

[57] ABSTRACT

A phase-locked laser array including a plurality of closely spaced channels in the surface of the substrate with lands therebetween with the laser oscillation occurring in a cavity region over each of the channels. A broad-area electrical contact provides uniform electrical current flow to each of the lasing regions. The individual oscillators are coupled by the overlap of their evanescent optical fields. The invention also includes a method of fabricating this array which includes the steps of forming a plurality of corrugations in the surface of a substrate, forming a solution having a super-saturated growth condition for planar and concave surfaces and an under-saturated growth condition for convex surfaces, contacting the corrugated surface to the solution thereby partially melting the convex portions of the surface and forming planar lands between the concave portions of the corrugations. Growth over the lands is delayed thereby providing a planar surface of the first layer upon which the remaining layers are then sequentially deposited.

8 Claims, 6 Drawing Figures

METHOD OF MAKING A LASER ARRAY

This is a division of application Ser. No. 505,489, filed June 17, 1983, now abandoned.

The invention relates to a monolithic array of semiconductor lasers whose individual optical fields interact with one another to produce a single, coherent output light beam.

BACKGROUND OF THE INVENTION

A semiconductor injection laser typically comprises a body of semiconductor material having a thin active region between cladding regions of opposite conductivity type. To increase the output power from such a laser, a guide layer having a refractive index which is intermediate between that of the active and cladding layers is interposed between one of the cladding regions and the active region. Light generated in the active layer propagates in both the active and guide layers thereby forming a larger beam at the emitting facet of the body. A thin active layer restricts oscillation in the transverse direction, the direction perpendicular to the plane of the layers, to the fundamental optical mode. In the lateral direction, the direction in the plane of the layers and perpendicular to a line between the laser facets, a similar restriction does not exist and oscillation typically occurs simultaneously in several different optical modes.

It has been found useful to introduce lateral variations into the laser structure which produce an optical waveguide which restricts the oscillation to the fundamental optical mode in the lateral direction. A channelled substrate laser formed by liquid phase epitaxy over a single channel in a substrate has an optical waveguide formed by lateral variations in the layer thicknesses and the close proximity of the absorbing substrate at the sides of the emitting region over the channels. The lateral flow of electrical current is not, however, automatically restricted to the emitting region over the channel but rather tends to flow to the substrate at the sides of the channel. To inhibit this lateral current flow, back-biased P-N junctions are typically formed in the substrate or overlying layers at the sides of the channels. Botez in U.S. Pat. No. 4,347,486, incorporated herein by reference, has disclosed a laser having a pair of channels in the surface of a substrate with a mesa therebetween. The layers overlying this channelled surface have laterally varying thicknesses because of the tendency for faster liquid-phase epitaxy growth over concave as opposed to flat or convex surfaces. This structure restricts the current flow to the region over the mesa and, because of the laterally varying layer thicknesses, produces an optical waveguide which restricts the oscillation to the fundamental lateral mode over the mesa up to an output power in excess of 40 milliwatts.

To increase the output power in the coherent light beam beyond the capability of an individual laser, monolithic arrays of spaced-apart laser devices have been fabricated where the modes of oscillation of the individual lasers are coupled to one another to form a single phase-locked coupled oscillator. Such lasers include a striped-oxide defined array having planar layers over a planar substrate which operates only in a pulsed mode and an array of mesa waveguide lasers where the emitting regions are over mesas on the substrate surface. This array appears to operate in a phase-locked mode in pulsed operation but is only partially phase-locked in continuous wave operation. Botez in U.S. Pat. No. 4,385,389 has disclosed a phase-locked array comprising a plurality of spaced-apart lasing elements of the type disclosed in U.S. Pat. No. 4,347,486, which can be operated cw in a fundamental lateral mode. In this array coupling between the modes of oscillation of the different elements of the array can occur over comparatively long distances because the individual devices have high lateral radiation leakage. However, the large inter-element spacing of the Botez array, required by the use of pairs of channels and the curvature of the layers, is undesirable since it increases the number of lobes in the far-field pattern. Thus it would be desirable to have a phase-locked laser array having the minimum spacing between the emitting elements and which operates in a single narrow beam peaked at 0°.

SUMMARY OF THE INVENTION

A phase-locked laser array includes a substrate having a plurality of substantially parallel channels in a surface thereof. A first cladding layer, a cavity region, comprising a guide layer and an active layer, and a second cladding layer sequentially overlie the surface of the substrate and the channels. A broad area electrical contact overlies the second cladding layer over the channels.

The individual oscillators over the separate channels are coupled to one another by the overlap of their evanescent fields primarily in the guide layer. The waveguides formed over the separate channels suppress the oscillation of higher order lateral modes over a wide range of output powers. The broad area contact provides a sufficiently uniform current distribution across the channels without the requirement for current confinement to the regions over the channels and without significantly increasing the threshold current.

The invention also includes a method of fabricating a laser array having planar active and guide layers over a channelled substrate which includes the steps of forming on the surface of the substrate a mesa having a plurality of corrugations in the surface thereof, sequentially depositing by liquid-phase epitaxy over the channels the first cladding layer, the active region, and the second cladding layer; and forming a broad electrical contact. The meltback of the convex portions of the corrugations during the initial stages of the deposition forms channels with lands therebetween and delays the growth of the layers over the channels thereby allowing the formation of the planar layers over the channelled surface.

DETAILED DESCRIPTION OF PREFERRED EMBODIMENTS

In the FIGURES the same elements in the different embodiments of the invention have the same identification.

Figure 1:
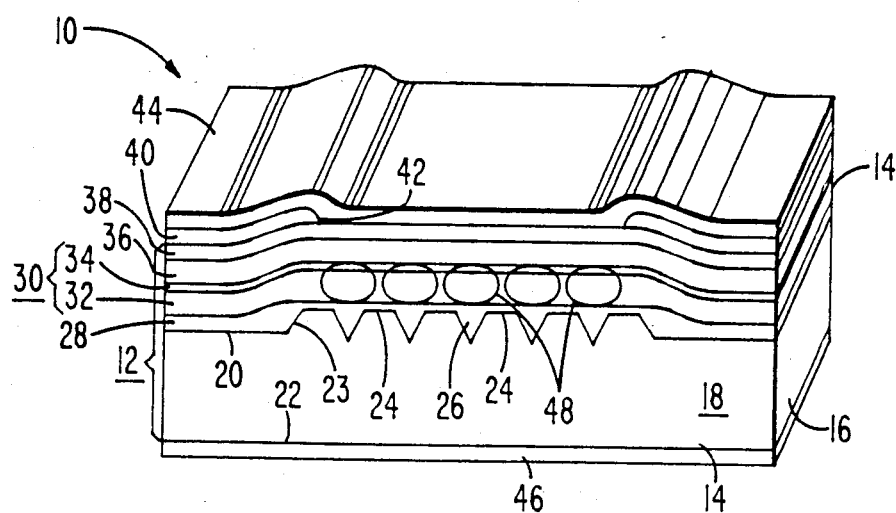
FIG. 1 is a prospective view of a first embodiment of the phase-locked array of the invention.

In FIG. 1 the laser array 10 comprises a body 12 of single crystalline semiconductor material having spaced, parallel end facets 14 which are reflecting to light at the laser wavelength with at least one of the end facets 14 being partially transparent so that light may be emitted therefrom. The body 12 also includes spaced, substantially parallel side surfaces 16 which extend between and are perpendicular to the end facets 14.

The body 12 includes a substrate 18 having spaced, parallel first and second major surfaces 20 and 22, respectively, which extend between and are perpendicular to both the end facets 14 and the side surfaces 16. In the first major surface 20 is a mesa 23 having a surface 24. A plurality of spaced, substantially parallel, vee-shaped channels 26 extends a distance into the mesa 23 from the surface 24 between the facets 14. A first cladding layer 28 overlies the surfaces 20 and 24 of the substrate and the mesa, respectively, and fills the channels 26. A cavity region 30, comprising a guide layer 32, overlying the first cladding layer 28 and an active layer 34 overlying the guide layer 32, overlies the first cladding layer 28. A second cladding layer 36 overlies the cavity region 30 and a capping layer 38 overlies the second cladding layer 36. An electrically insulating layer 40, having an opening 42 extending therethrough over the channels 26, overlies the capping layer 38. A broad area electrical contact 44 overlies the capping layer 38 in the region of the opening 42 and the electrically insulating layer 40. A substrate electrical contact 46 overlies the second major surface 22 of the substrate 18.

Figure 2:
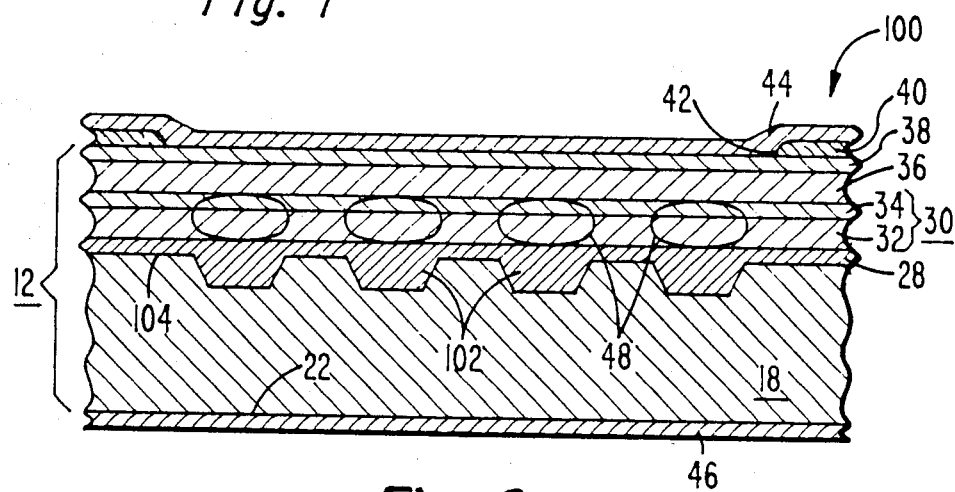
FIGS. 2 and 3 are cross-sectional views of second and third embodiments of the phase-locked array of the invention.

In FIG. 2 the laser array 100 differs from the array 10 of FIG. 1 in that the channels 102 extend a distance into a substantially flat major surface 104 of the substrate 18. The channels 102 differ from the channels 26 of the array 10 in that the channel bottoms are flat.

Figure 3:
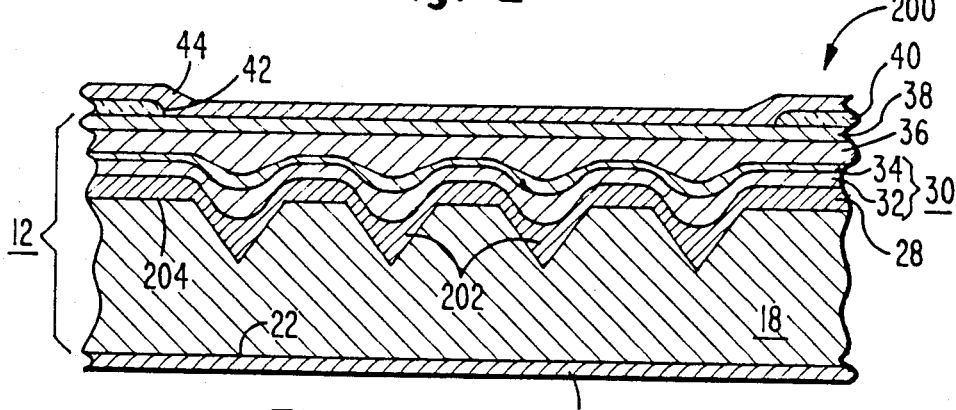

In FIG. 3 the laser array 200 differs from the array 10 in that vee-shaped channels 202 extend a distance into a substantially flat major surface 204 of the substrate 18. The array 200 differs from the arrays 10 and 100 in that the cladding layers 28 and 36, the guide layer 32, and the active layer 34 have laterally varying thicknesses with the guide layer 32 and the active layer 34 being thickest over the channels 202.

The laser array of the invention may be formed of materials such as GaAs and AlGaAs which have the requisite refractive index differences. Alternatively, other Group III or V elements such as InP, Ga and As may be used. The alloys used for the particular layers of the array should be such that the refractive index of the active layer 34 is greater than the refractive index of the guide layer 32 which in turn is greater than the refractive index of the cladding layers 28 and 36.

The substrate 18 and the first cladding layer 28 are of one conductivity type and the second cladding layer 36 and the capping layer 38 are of the opposite conductivity type. In the cavity region 30 the positions of the guide layer 32 and the active layer 34 are interchangeable. The guide layer 32 is preferably positioned between the first cladding layer 28 and the active layer 34 and, in this case, has the same conductivity as the first cladding layer 28. In some applications the guide layer 32 may be positioned between the active layer 34 and the second cladding layer 36 in which case the guide layer 32 has the same conductivity type as the second cladding layer 36.

The substrate 18 is preferably composed of N-type GaAs having a first major surface 20 which is parallel to the (100) crystallographic plane. The substrate may be misoriented from this orientation but preferably a {100} plane is used. The channels are preferably uniformly spaced and are typically between about 1.5 and 2.5 micrometers ($\mu$m) deep, having a width at the surface 20 between about 3.5 and 4.5 $\mu$m with a typical center-to-center spacing between the channels of between about 4 and 6 $\mu$m. Larger center-to-center spacings are also useful in which case the other dimensions change accordingly. The channels are typically vee-shaped with planar surface lands therebetween. Alternatively the channels may have another shape such as the flat bottom channels illustrated in FIG. 2.

The first cladding layer 28 is typically composed of N-type $Al_rGa_{1-r}As$ where r is between about 0.20 and 0.45 and preferably between about 0.25 and 0.35. This layer is comparatively thin over the lands between the channels, being between about 0.1 and 0.4 $\mu$m and typically about 0.25 $\mu$m thick and preferably fills the channels, producing a planar layer surface of the first cladding layer 28 upon which the succeeding layers are deposited. Alternatively the deposition of the first cladding layer 28 is controlled so that the channels are not filled thereby producing a curved surface of the first cladding layer 28.

The guide layer 32 is typically composed of N-type $Al_xGa_{1-x}As$ where x is between about 0.15 and 0.30 and preferably between about 0.18 and 0.25. The layer is typically planar and is between about 0.3 and 0.6 $\mu$m thick and preferably about 0.4 $\mu$m thick. If the layer is non-planar, as illustrated in FIG. 3, it is typically between about 0.3 and 0.6 $\mu$m thick over the channels and between about 0.1 and 0.4 $\mu$m thick over the lands between the channels.

The active layer 34 is typically composed of $Al_yGa_{1-y}As$ where y is between about 0.0 and 0.15, and preferably between about 0.03 and 0.12 and is preferably undoped. If the active layer 34 is planar, it is typically between about 0.05 and 0.12 $\mu$m thick. If it is formed on a curved surface, it is typically between about 0.05 and 0.12 $\mu$m thick over the channels and thinner but nonzero over the planar lands between the channels.

The second cladding layer 36 is typically composed of P-type $Al_zGa_{1-z}As$ where z is between about 0.25 and 0.45, and preferably between about 0.28 and 0.35. This layer is typically between about 0.18 and 1.5 $\mu$m thick.

The capping layer 38 is typically composed of P-type GaAs and is used to facilitate ohmic electrical contact between the underlying semiconductor material and the overlying metal contact. This layer is typically between about 0.5 and 1.0 $\mu$m thick.

The electrically insulating layer 40 is preferably composed of silicon dioxide which is deposited on the capping layer 38 by pyrolytic decomposition of a silicon-containing gas, such as silane, in oxygen or water vapor. An opening 40 is formed through the electrically insulating layer down to the capping layer 38 over the channels 26 using standard photolithographic masking techniques and etching processes. The broad area electrical contact 44 is then deposited over the capping layer 38 where it is exposed to the opening 42. The broad area electrical contact 44 is preferably composed of sequentially evaporated titanium, platinum, and gold. A substrate electrical contact 46 is deposited on the major surface 22 of the substrate 18 by sequential evaporation and sintering of tin and silver followed by a plated nickel layer and a layer of gold.

The emitting end facet 14 of the array is typically coated with a layer of $Al_2O_3$ or a similar material having a thickness of about one-half wave at the lasing wavelength as disclosed by Ladany et al in U.S. Pat. No. 4,178,564. The opposed end facet 14 is coated with a reflector consisting of an electrical insulator such as SiO$_2$ coated with a layer of gold as disclosed by Caplan et al in U.S. Pat. No. 3,701,047. Alternatively the mirror may be a multi-layer reflector such as that disclosed by Ettenberg in U.S. Pat. No. 4,092,659. All three of these patents are incorporated herein by reference.

The laser array of the invention may be fabricated using well-known photolithographic masking techniques and etching processes to form the channels followed by standard liquid-phase epitaxy techniques such as those disclosed by Lockwood et al in U.S. Pat. No. 3,753,801, incorporated herein by reference, and by Botez in U.S. Pat. No. 4,347,486 to deposit the layers over the substrate surface containing the channels. The etching processes to form the channels may include selective chemical etching of a surface having a particular crystallographic orientation or ion etching. These techniques are well known in the art.

Figure 4:
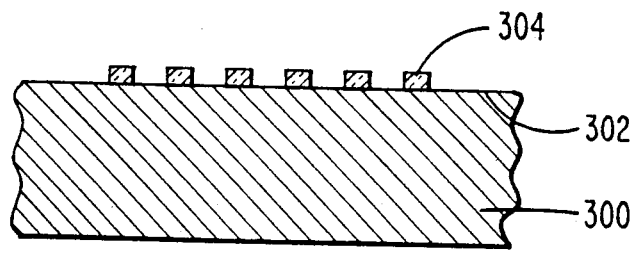
FIGS. 4–6 are cross-sectional views of the substrate at different steps of the formation of the mesa with the channels in a surface thereof.
Figure 5:
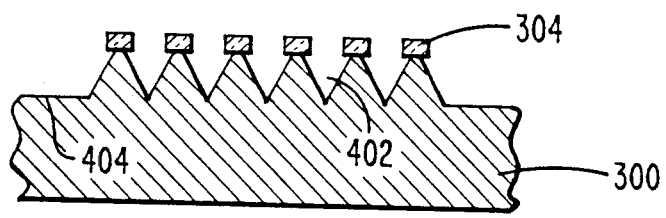

Alternatively the layers may be formed by first forming a series of adjacent vee-shaped channels thereby forming a corrugated surface as shown in FIGS. 4 and 5. In FIG. 4 a GaAs substrate 300 has formed on a major surface 302 thereof, which is preferably the (100) crystallographic plane, a plurality of stripes 304 composed of an etch-resistant material such as SiO$_2$. The stripes are formed using standard photolithographic masking techniques and etching processes and are preferably oriented along a (01$\bar{1}$) crystallographic direction on the (100) oriented surface. A preferential etch is then applied to the exposed surface of the substrate to form the vee-shaped channels as shown in FIG. 5. Channels 402 having a vee shape are formed by underetching the stripes 304 to the point where only a small portion of the original surface remains to support the stripes. The surface 302 outside the region of the stripes is also removed forming a new surface 404, leaving a mesa with a plurality of corrugations in the surface thereof.

The substrate having the corrugated surface is then inserted into a liquid-phase epitaxy apparatus such as that disclosed by Lockwood et al and brought into contact with the solution from which the first layer is to be deposited on the channels 402 and the surface 404.

The sequence of events which occur at the onset of the liquid-phase epitaxy deposition process depends critically on the characteristics of the solution and the shape of the substrate surface contacted by the solution. In the simplest case, a saturated solution of the elements to be deposited and an element which is a solvent for the substrate material is brought into contact with a planar surface. At this point neither deposition nor meltback of the substrate occurs since the substrate and solution are in equilibrium. The combination of the substrate and solution is then cooled causing the solution to become super-saturated and deposition occurs.

However, if the surface is not planar but has a locally varying radius of curvature, then the degree of saturation of the contacting solution also locally varies. If the solution is just saturated for a planar surface, it will be super-saturated over concave portions of the surface, as viewed from the direction of the solution, and under-saturated over convex portions of the surface. Over the curved portion of the surface two effects can then occur. First, deposition occurs on the concave portions of the surface over which the solution is super-saturated and, second, melting of the substrate occurs on the convex portions of the surface over which the solution is under-saturated.

Figure 6:
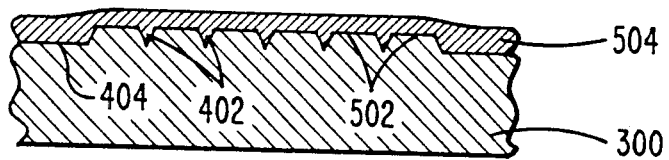

Applying these principles to the corrugated surface of the substrate 300, as shown in FIG. 6, the convex portions of the corrugations, that is, the tips of the projections which form the channel, undergo meltback forming the planar lands 502 between the concave portions of the corrugations, now forming the channels. This meltback locally delays the growth over the newly formed lands 502. The growth proceeds in the channels 402 so that after an interval of time the surface of the deposited layer over the channels 402 and the lands 502 becomes planar. The growth then proceeds uniformly over the entire planar surface.

We have found that an AlGaAs cladding layer can be deposited on the corrugated surface to provide planar layers over channels by carefully controlling the temperature of the solution, the degree of super-cooling used, and the cooling rate. In particular, we have found that an initial growth temperature, typically the temperature at which the solution is equilibrated, between 700° C. and 800° C., and preferably about 760° C. should be used. The range of temperatures through which the solution and substrate are cooled to a lower temperature is between about 2° and 10° C. and preferably between 4° and 5° C. The cooling rate is between about 0.5° and 5° C. and preferably about 1° C. per minute. In this temperature range the rate of growth is significantly slower than for the range of growth temperatures between 850° C. and 950° C. which are typically used. In addition, the meltback of the convex surfaces can be controlled and fill-in of the channels to form a planar surface occurs more readily. At higher temperatures the thermal decomposition rate of the corrugated surface due to arsenic loss is much higher.

The steps of the novel method for fabricating a phased array of closely spaced lasers are to form a plurality of adjacent corrugations on the surface of a substrate with the axis of the corrugations extending between the end facets. Typically, a solution containing the elements to be deposited is equilibrated at a first temperature in contact with a source wafer as disclosed by Lockwood et al in U.S. Pat. No. 3,741,825, incorporated herein by reference. Preferably, the solution and substrate are then separately cooled through a range of temperatures to create a super-saturated growth condition for concave and planar portions of the surface and a slightly under-saturated growth condition for convex portions of the surface. The solution and substrate are then contacted by sliding a wafer into contact with the solution thereby causing a partial melt-back of the convex portions, or tips, of the corrugations to form the lands between the concave portions of the corrugations, the channels. Deposition of the first cladding layer begins and continues until the planar surface of the deposited layer is formed over the convex and concave portions of the original corrugations. The remaining semiconductor layers of the laser array are then deposited on this planar surface using standard liquid-phase epitaxy techniques.

In the operation of the laser array under forward bias, electrical current flows into the semiconductor material through the broad-area electrical contact which extends laterally over all the active channels. Lasing action occurs over each channel in the active region and propagation of the lasing light beam occurs in both the active and guide layers over each channel. Surprisingly, we have found that the emission from the individual oscillators is in the fundamental lateral mode without the use of any lateral conductivity variations to confine the electrical current to the portions of the active layer over the channels, as is typically required for single oscillators of this type. It appears that the combination of uniform current flow from the broad-area contact coupled with the close proximity of the absorbing substrate to the active and guide layers over the lands between the channels is sufficient to allow only the fundamental lateral mode to oscillate. The close proximity of the individual oscillators to one another in this structure permits this to happen without incurring an excessive penalty in increased threshold current.

Coupling between the oscillators over adjacent channels occurs through the overlap of their evanescent optical fields. This coupling can occur with a 0° phase shift between the oscillators which, for coupled oscillators each oscillating in the fundamental lateral mode, can produce a single output beam normal to the facet. Alternatively, the coupling can occur with a 180° phase shift between the oscillators which, for oscillators oscillating in the fundamental mode, can produce a pair of symmetrical output lobes in the output beam which are spaced apart by an angle of about 5°-10° depending upon the lateral separation of the oscillators.

The invention is illustrated by the following Example but it is not intended to be limited to the details described therein.

EXAMPLE

Nine element phase-locked laser arrays were fabricated using the method of the invention. A mask having sets of stripes which included 2 μm openings between 3 μm stripes of $SiO_2$ were formed on a (100) surface of an N-type GaAs substrate wafer. The long dimensions of the stripes were oriented along the $[01\bar{1}]$ crystallographic direction of the substrate. The substrate was then etched to form the sets of channels in an etchant solution comprising 1 $H_2SO_4$:8 $H_2O_2$:8 $H_2O$. Under-etching of the $SiO_2$ stripes produced approximately triangular-shaped channels 2.2 μm deep with a 5 μm center-to-center spacing. The material outside the region of the channels was also removed so that the triangular-shaped portions of the substrate material projected from the resulting etched surface of the remainder of the substrate for each set.

The substrate was then inserted into a multi-bin boat of the type described by Lockwood et al which contained in one bin a solution formed by combining 3 grams of Ga, 25 milligrams (mg) of GaAs, 1.9 mg of Al and 200 mg of Sn. The solution was equilibrated against a GaAs source wafer at 760° C. The substrate and the growth solution for the first cladding layer were then separately cooled about 4°-5° C. from an initial temperature of 760° C. at a rate of about 1° C. per minute. The substrate and solution were then brought into contact for deposition of the first cladding layer. The triangular-shaped projections were initially melted back by about 1.3 μm leaving 0.9 μm deep triangularly shaped channels with planar lands therebetween. Deposition of the layers was then carried out resulting in the following sequence of layers: an N-type $Al_{0.3}Ga_{0.7}As$ layer 0.25 μm thick over the lands; an N-type $Al_{0.22}Ga_{0.78}As$ guide layer 0.4 μm thick; an $Al_{0.07}Ga_{0.93}As$ active layer 0.06 μm thick; a P-type $Al_{0.35}Ga_{0.65}As$ second cladding layer 0.8 μm thick and a P-type GaAs capping layer 0.3 μm thick. An $SiO_2$ insulating layer about 0.1 μm thick was deposited on the capping layer and 50 μm wide openings for the broad area contacts were formed over the channels using standard photolithographic and etching techniques. Ti, Pt, and Au were then deposited over the oxide and the capping layer by vacuum evaporation. The substrate electrical contact was formed by vacuum deposition of Ag and Sn followed by a sintering step. This surface was then plated with Ni and coated with Au.

The wafer was then cleaved to form slivers. One facet of the slivers was coated with about 0.27 μm of $Al_2O_3$ and the second facet was coated with a six-layer dielectric stack reflector. Individual dice from the slivers were then mounted for test.

The devices were tested in a pulse mode using 100 nsec pulses at a 1 kHz rate and at cw. Different devices exhibited threshold currents between 250 and 400 ma with peak pulsed output powers up to 400 mw and cw output powers up to 80 mw. A number of the devices tested exhibited a two-lobe far field pattern consistent with 180° phase-shift operation. Others exhibited a single lobe characteristic of 0° phase-shift operation in pulse mode operation. The quality of these far field patterns improved with increasing cw output power indicating that the coupling between emitting elements is increasing with increasing drive level.

We claim:

1. A method of fabricating a laser array including a planar active layer comprising the steps of:
    forming a plurality of corrugations on a surface of a substrate, said corrugations projecting outwards from the surface of the remainder of the substrate;
    forming a first solution comprising the elements to be deposited and an element which is a solvent for the substrate material which has a super-saturated growth condition for planar and concave substrate surfaces and a slightly under-saturated growth condition for convex surfaces of the substrate;
    contacting the surface of the substrate having the corrugations thereon to the first solution thereby causing a partial melting of the convex portions of the corrugations to form lands between the concave portions of the corrugations and causing the deposition of a first layer to occur over the concave portions of the corrugations and the lands until this layer has a planar surface; and
    contacting the substrate with the first layer thereon to a different solution and cooling the different solution and substrate to deposit the active layer over the planar surface of the first layer.

2. The method of claim 1 wherein the step of forming the solution comprises the steps of equilibrating the first solution at an equilibration temperature and cooling the first solution to a lower temperature.

3. The method of claim 2 wherein the substrate is at said lower temperature.

4. The method of claim 3 wherein the substrate is GaAs, the solution comprises Al, Ga and As.

5. The method of claim 4 wherein said lower temperature at which the solution in contact with the planar portion of the surface is saturated is between about 700° C. and 800° C.

6. The method of claim 5 wherein said lower temperature is about 760° C.

7. The method of claim 6 wherein the differences between the equilibration and lower temperatures is between about 2° and 10° C. and the cooling rate is between about 0.5° and 5° C. per minute.

8. The method of claim 7 wherein said difference is between about 4° and 5° C. and the cooling rate is about 1° C. per minute.

* * * * *